United States Patent
Yoshida et al.

(10) Patent No.: US 6,759,322 B2
(45) Date of Patent: Jul. 6, 2004

(54) METHOD FOR FORMING WIRING STRUCTURE

(75) Inventors: Hideaki Yoshida, Osaka (JP); Tetsuya Ueda, Osaka (JP); Masashi Hamanaka, Nara (JP); Takeshi Harada, Niigata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/328,171

(22) Filed: Dec. 26, 2002

(65) Prior Publication Data

US 2003/0224594 A1 Dec. 4, 2003

(30) Foreign Application Priority Data

Dec. 27, 2001 (JP) ........................................ 2001-396419

(51) Int. Cl.[7] ........................................ H01L 21/4763
(52) U.S. Cl. ........................ 438/626; 438/627; 438/629; 438/631; 438/633; 438/636; 438/637; 438/638; 438/643; 438/645; 438/648; 438/653; 438/656; 438/672; 438/687; 438/692; 438/700; 438/906; 438/952; 438/959
(58) Field of Search ........................ 438/648, 656, 438/687, 959, 963, 622–627, 629, 631, 633, 636–638, 643, 645, 653, 672, 692–693, 700, 738, 906, 952

(56) References Cited

U.S. PATENT DOCUMENTS

| | | | | |
|---|---|---|---|---|
| 6,174,810 B1 | * | 1/2001 | Islam et al. | 438/687 |
| 6,184,128 B1 | * | 2/2001 | Wang et al. | 438/637 |
| 6,274,478 B1 | * | 8/2001 | Farkas et al. | 438/626 |
| 6,274,499 B1 | * | 8/2001 | Gupta et al. | 438/692 |
| 6,358,849 B1 | * | 3/2002 | Havemann et al. | 438/689 |
| 6,444,569 B2 | * | 9/2002 | Farkas et al. | 438/633 |
| 6,468,135 B1 | * | 10/2002 | Cruz et al. | 451/41 |
| 6,573,173 B2 | * | 6/2003 | Farkas et al. | 438/633 |
| 2002/0102834 A1 | * | 8/2002 | Yang | 438/618 |

FOREIGN PATENT DOCUMENTS

| | | |
|---|---|---|
| JP | 10-214834 | 8/1998 |
| JP | 2000-340531 | 12/2000 |
| JP | 2001-156029 | 6/2001 |

* cited by examiner

*Primary Examiner*—Lynne Gurley
(74) *Attorney, Agent, or Firm*—McDermott, Will & Emery

(57) ABSTRACT

After a plurality of grooves are formed in an insulating film and in an anti-reflection film on the insulating film, a barrier metal film and a conductive film are deposited on the anti-reflection film such that each of the wiring grooves is filled therewith. Subsequently, the portions of the conductive film outside the grooves are removed by polishing and then the portions of the barrier metal film outside the wiring are removed by polishing. Thereafter, a foreign matter adhered to a surface to be polished during polishing is removed and then a surface of the anti-reflection film is polished.

41 Claims, 10 Drawing Sheets

METHOD FOR FORMING WIRING STRUCTURE

BACKGROUND OF THE INVENTION

The present invention relates to a method for forming a wiring structure in a semiconductor device.

As a conventional method for forming a wiring structure, there has been used one disclosed in, e.g., Japanese Laid-Open Patent Publication No. HEI 10-214834. Referring to the drawings, the conventional method for forming a wiring structure will be described by using, as an example, the case where plugs are formed in holes formed in an insulating film.

FIGS. 9A to 9C are cross-sectional views illustrating the individual process steps of the conventional method for forming a wiring structure.

First, as shown in FIG. 9A, a silicon dioxide film 12 having a thickness of about 1 $\mu$m is deposited as an insulating film on a silicon substrate 11. Then, holes 13 each having a diameter of about 0.8 $\mu$m are formed by lithography and dry etching in specified regions of the silicon dioxide film 12 to extend therethrough.

Next, a titanium film 14 having a thickness of 30 nm and serving as a lower-layer conductive film and a titanium nitride film 15 having a thickness of 100 nm and serving as an interlayer conductive film are deposited successively by PVD (physical vapor deposition) over the entire surface of the silicon dioxide film 12 including the holes 13. Thereafter, a tungsten film 16 having a thickness of 1 $\mu$m and serving as an upper-layer conductive film is deposited by CVD (chemical vapor deposition) over the entire surface of the titanium nitride film 15, whereby a conductive film having a three-layer structure is deposited. In the three-layer conductive film, each of the titanium film 14 and the titanium nitride film 15 is a barrier metal.

Next, the respective portions of the tungsten film 16 and the titanium nitride film 15 deposited on regions outside the holes 13 are removed by chemical mechanical polishing (CMP) using an abrasive agent, as shown in FIG. 9B. This completely exposes the portions of the titanium film 14 deposited on the regions outside the holes 13.

Next, the portions of the titanium film 14 deposited on the regions outside the holes 13 are removed by CMP using another abrasive agent, as shown in FIG. 9C. This forms plugs 17 composed of tungsten in the holes 13 and exposes the silicon dioxide film 12.

Although the formation of tungsten plugs has been described above by way of example, it is also possible to form, e.g., copper wires in wiring grooves formed in an insulating film by the same method.

With the scaling down of a wiring pattern, the spacing between adjacent wires (wire-to-wire spacing) has been reduced increasingly so that an anti-reflection layer (hereinafter referred to as ARL) has been used in a lithographic step for forming wiring grooves, via holes, and the like.

However, the formation of wires using an ARL film based on the foregoing conventional method for forming a wiring structure has the problem that a short circuit occurs between wires.

SUMMARY OF THE INVENTION

It is therefore an object of the present invention to prevent a short circuit between wires buried in an insulating film and in an ARL film on the insulating film.

To attain the object, the present inventors have examined causes for the short circuit occurring between the wires in the conventional method for forming a wiring structure and made the following finding.

In forming wires in accordance with the conventional method for forming a wiring structure, a barrier metal under polishing locally peels off to form a foreign matter. Since the foreign matter is hard, if an ARL film composed of a material more fragile than an insulating film present between wires has been formed on the insulating film, the foreign matter causes a microcrack in a surface of the ARL film. In the case where the microcrack extends from one wire to another wire adjacent thereto, if a metal (the barrier metal or a conductive film) is buried in the microcrack during the formation of wiring, a short circuit occurs between the wires.

Since the spacing between wires is reduced as the wiring structure is scaled down, the microcrack mentioned above is more likely to extend between the adjacent wires so that the metal buried in the microcrack is more likely to form a pseudocross-linking structure between the wires. As a result, a short circuit is more likely to occur between the wires.

FIG. 10 is a plan view showing the metal buried in the microcrack caused in the ARL film between the wires. As shown in FIG. 10, a plurality of copper wires 22 are buried in an ARL film 21 in such a manner as to extend in parallel with each other. A crack 23 has been formed in the ARL film 21 between the copper wires 22 in such a manner as to extend therebetween. Copper was buried in the crack 23 during the formation of the copper wires 22 so that a short circuit occurs between the copper wires 22.

The present invention has been achieved in view of the foregoing finding. Specifically, a method for forming a wiring structure according to the present invention comprises: a groove forming step of forming an anti-reflection film on an insulating film and then forming, in each of the anti-reflection film and the insulating film, a first groove and a second groove adjacent to the first groove; a film depositing step of depositing a barrier metal film and a conductive film on the anti-reflection film such that each of the first and second grooves is filled therewith; a first polishing step of removing the portion of the conductive film outside the first and second grooves by polishing; a second polishing step of removing, after the first polishing step, the portion of the barrier metal film outside the first and second grooves by polishing; a foreign matter removing step of removing a foreign matter adhered to a surface to be polished after the second polishing step in the second polishing step therefrom; and a third polishing step of polishing, after the foreign matter removing step, a surface of the anti-reflection film.

In the method for forming a wiring structure according to the present invention, the barrier metal film and the conductive film are buried in the grooves formed in the insulating film and in the anti-reflection film on the insulating film and then the respective portions of the conductive film and the barrier metal film outside the grooves are removed by polishing. Thereafter, the foreign matter adhered to the surface to be polished during polishing is removed and then the surface of the anti-reflection film is polished. This achieves the following effects if a microcrack is formed in the surface of the anti-reflection film present between the grooves (i.e., between wires) during the polishing of the barrier metal film and a metal is buried in the microcrack. Since final polishing is performed with respect to the surface of the anti-reflection film after the foreign matter adhered to the surface to be polished during the polishing of the barrier metal film or the like is removed therefrom, it is possible to remove the metal buried in the microcrack, while preventing new damage caused by the foreign matter to the surface of the anti-reflection film. This allows the situation in which the metal buried in the microcrack causes cross-linking between the wires to be circumvented and thereby reduces the frequency of short circuits occurring between the wires. As a result, high-performance wiring can be formed.

Preferably, the method for forming a wiring structure according to the present invention further comprises, between the second and third steps, the step of removing a foreign matter adhered to a polishing pad used in the second polishing step therefrom.

The arrangement more reliably prevents damage to the surface of the anti-reflection film if the polishing pad used in the second polishing step (polishing of the barrier metal film) is used in the third polishing step (polishing of the anti-reflection film). In this case, if the step of removing the foreign matter adhered to the polishing pad therefrom includes the step of cleaning the polishing pad, damage to the surface of the anti-reflection film can be prevented more reliably. The same effect is achievable if the step of removing the foreign matter adhered to the polishing pad therefrom includes the step of brushing a surface of the polishing pad with a grindstone.

In the method for forming a wiring structure according to the present invention, each of the second and third polishing steps is preferably performed by using the same polishing system and the same polishing pad.

The arrangement improves work efficiency in the formation of wiring.

In the method for forming a wiring structure according to the present invention, a pressure under which the surface to be polished is pressed onto a polishing pad and a rotating speed of the polishing pad in the third polishing step are preferably the same as in the second polishing step.

The arrangement obviates the necessity to make intricate changes to polishing conditions in a transition from the second polishing step to the third polishing step. Accordingly, work efficiency in the formation of wiring is improved and a reduction in process throughput is thereby prevented. If the polishing time is shorter in the third polishing step than in the second polishing step, the surface of the antireflection film is prevented from being significantly scraped off. If the foregoing pressure and rotating speed are lower in the third polishing step than in the first polishing step, the significant scraping-off of the surface of the anti-reflection film can be prevented more reliably.

In the method for forming a wiring structure according to the present invention, an abrasive agent used in the third polishing step is preferably the same as used in the second polishing step.

The arrangement prevents the conductive film buried in the grooves from being significantly polished in the third polishing step so that an increase in wiring resistance is prevented.

In the method for forming a wiring structure according to the present invention, the third polishing step may include a polishing step performed in two stages under different polishing conditions. In this case, an abrasive agent used in one of the two stages of the polishing step is preferably the same as used in the second polishing step and an abrasive agent used in the other of the two stages of the polishing step is preferably the same as used in the first polishing step. The arrangement improves a yield rate in the formation of wiring.

In the method for forming a wiring structure according to the present invention, the foreign matter removing step preferably includes the step of cleaning the surface to be polished by using an organic acid or an organic alkali.

The arrangement ensures the removal of the foreign matter adhered to the surface to be polished.

In the method for forming a wiring structure according to the present invention, if a spacing between the first and second grooves is 0.25 $\mu$m or less, the present invention more remarkably achieves the foregoing effects than the prior art.

In the method for forming a wiring structure according to the present invention, the first and second grooves may be arranged in parallel with each other.

In the method for forming a wiring structure according to the present invention, formation of wires in the first and second grooves may be performed by a dual damascene method.

In the method for forming a wiring structure according to the present invention, the anti-reflection film may be composed of a silicon containing material.

The arrangement ensures an improved accuracy with which a pattern is formed in a lithographic step for forming the grooves. If a KrF excimer laser beam (at a wavelength of 248 nm), e.g., is used as a light source in the lithographic step, a multilayer film consisting of a lower-layer SiON film having a thickness of 75 nm and an upper-layer $SiO_2$ film having a thickness of 8 nm exhibits a high absorption efficiency to the KrF excimer laser beam so that the multilayer film has excellent performance as an anti-reflection film. If a silicon compound is used as a material composing the anti-reflection film, equipment for forming a hole in the silicon dioxide film can be used commonly as equipment for forming a hole in the anti-reflection film, which achieves a reduction in fabrication cost for the semiconductor device.

In the method for forming a wiring structure according to the present invention, the conductive film is preferably a copper film and the barrier metal film is preferably a tantalum film, a tantalum nitride film, or a multilayer film composed of a tantalum film and a tantalum nitride film.

The arrangement allows the formation of low-resistance wiring. In this case, a wire formed in the first or second groove may be connected electrically to a plug formed under the wire.

DETAILED DESCRIPTION OF THE INVENTION

Embodiment 1

Figure 1A:
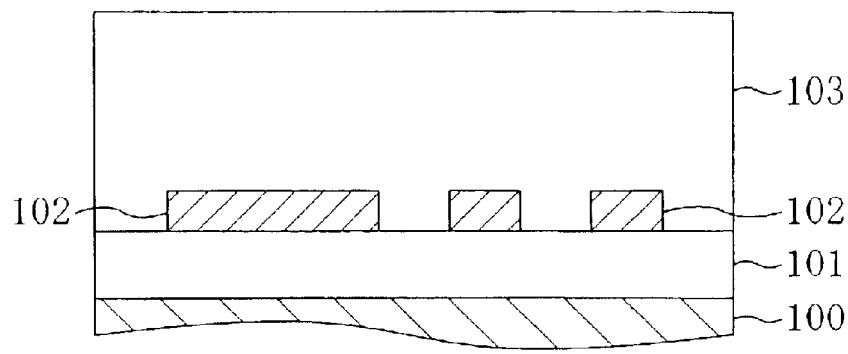
FIGS. 1A to 1C are cross-sectional views illustrating the individual process steps of a method for forming a wiring structure according to a first embodiment of the present invention.

Referring to the drawings, a description will be given herein below to a method for forming a wiring structure according to a first embodiment of the present invention.

FIGS. 1A to 1C, FIGS. 2A and 2B, FIGS. 3A and 3B, and FIG. 4 are cross-sectional views illustrating the individual process steps of the method for forming a wiring structure according to the first embodiment.

First, as shown in FIG. 1A, a first silicon dioxide film 101 is formed on a substrate 100 composed of, e.g., silicon. Then, lower-layer wires 102 each composed of; e.g., a tungsten film are formed on the first silicon dioxide film 101. Thereafter, a second silicon dioxide film 103 is deposited by, e.g., CVD over the upper surface of the first silicon dioxide film 101 including the upper surfaces of the lower-layer wires 102.

Figure 1B:
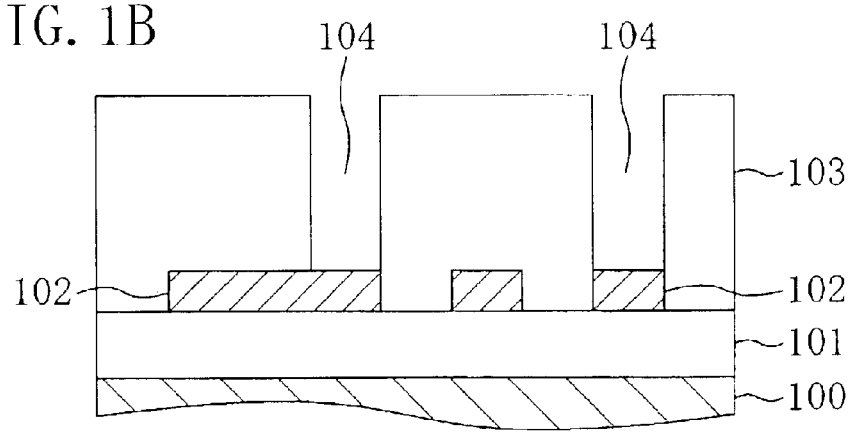

Next, as shown in FIG. 1B, via holes 104 reaching the lower-layer wires 102 are formed by lithography and dry etching in the second silicon dioxide film 103.

Figure 1C:
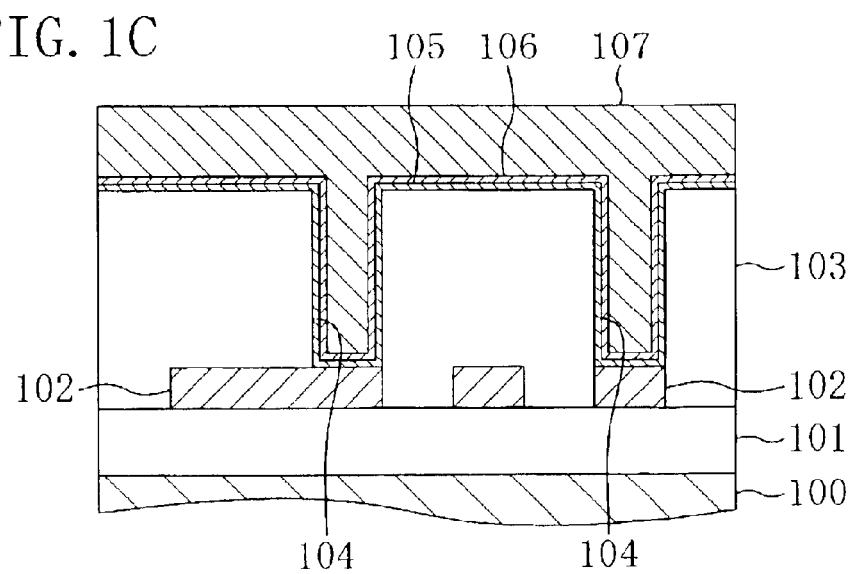

Next, as shown in FIG. 1C, a titanium (Ti) film 105 and a titanium nitride (TiN) film 106 are deposited successively by, PVD or CVD on the second silicon dioxide film 103 such that the via holes 104 are filled midway therewith. Then, a tungsten film 107 is formed by, e.g., CVD on the titanium nitride film 106 such that the via holes 104 are filled completely therewith. In the resulting structure, each of the titanium film 105 and the titanium nitride film 106 is a barrier metal.

Figure 2A:
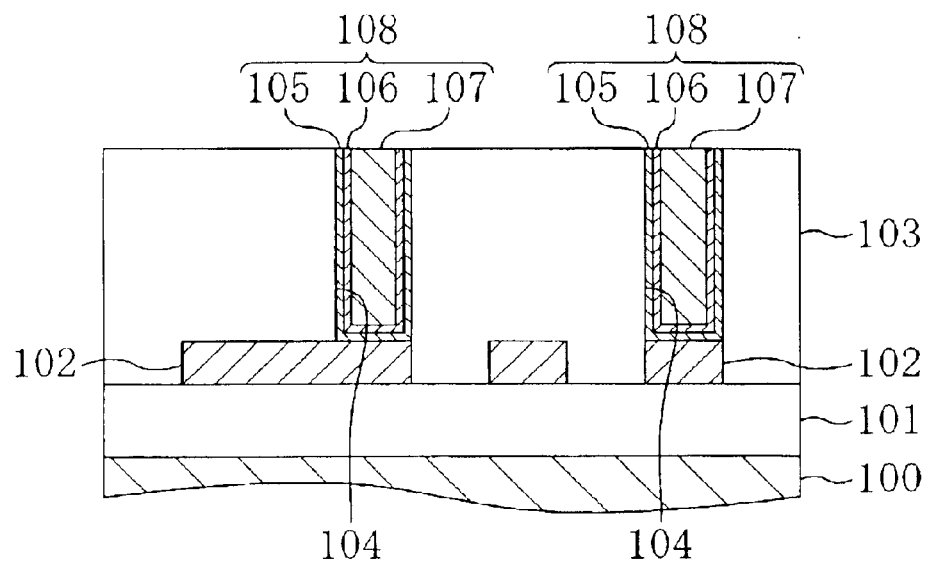
FIGS. 2A and 2B are cross-sectional views illustrating the individual process steps of the method for forming a wiring structure according to the first embodiment.

Next, as shown in FIG. 2A, the respective portions of the titanium film 105, the titanium nitride film 106, and the tungsten film 107 deposited on regions outside the via holes 104 are removed by, e.g., CMP. As a result, plugs 108 composed of tungsten which are protected reliably by the barrier metals are formed in the via holes 104 in the second silicon dioxide film 103.

Figure 2B:
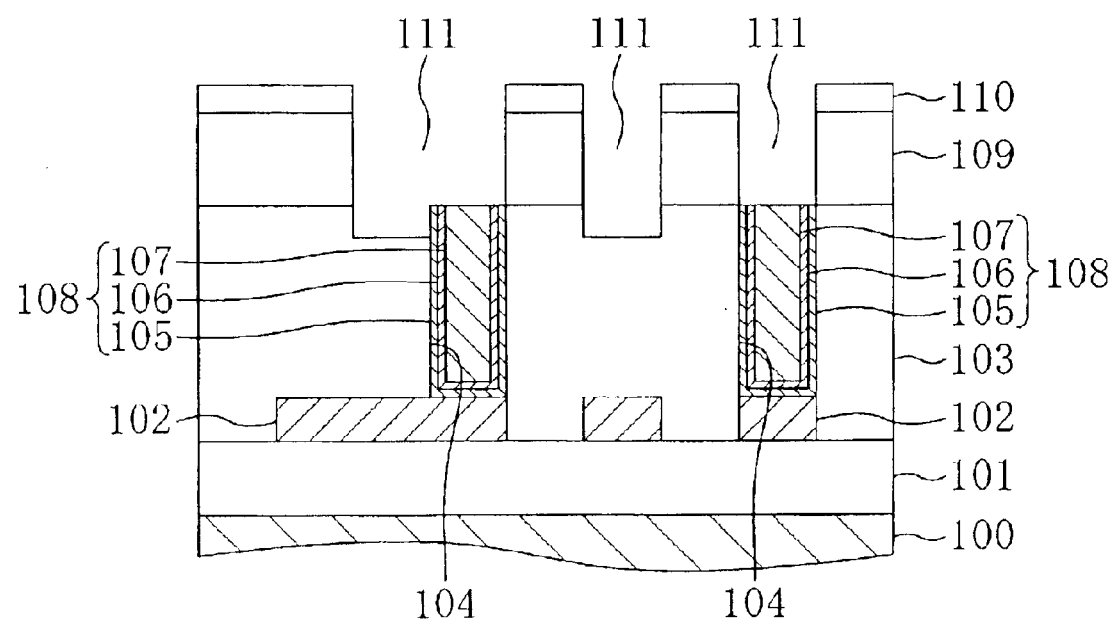

Next, as shown in FIG. 2B, a silicon dioxide film 109 doped with fluorine (hereinafter referred to as an FSG (Fluorine Doped Silicate Glass) film) and an ARL film 110 is deposited successively by, e.g., CVD on the second silicon dioxide film 103. The ARL film 110 has a two-layer structure consisting of, e.g., an upper-layer SiON film and a lower-layer $SiO_2$ film as well as the function of improving resolution during exposure in the subsequent lithographic step. Then, a plurality of wiring grooves (trenches) 111 are formed by lithography and dry etching in the ARL film 110 and in the FSG film 109 (and in the surface portion of the second silicon dioxide film 103). It is to be noted that the plurality of wiring grooves 111 include wiring grooves reaching the plugs 108. The wiring grooves 111 are arranged in, e.g., parallel with each other and the spacing between the wiring grooves 111 is about 0.25 μm.

Figure 3A:
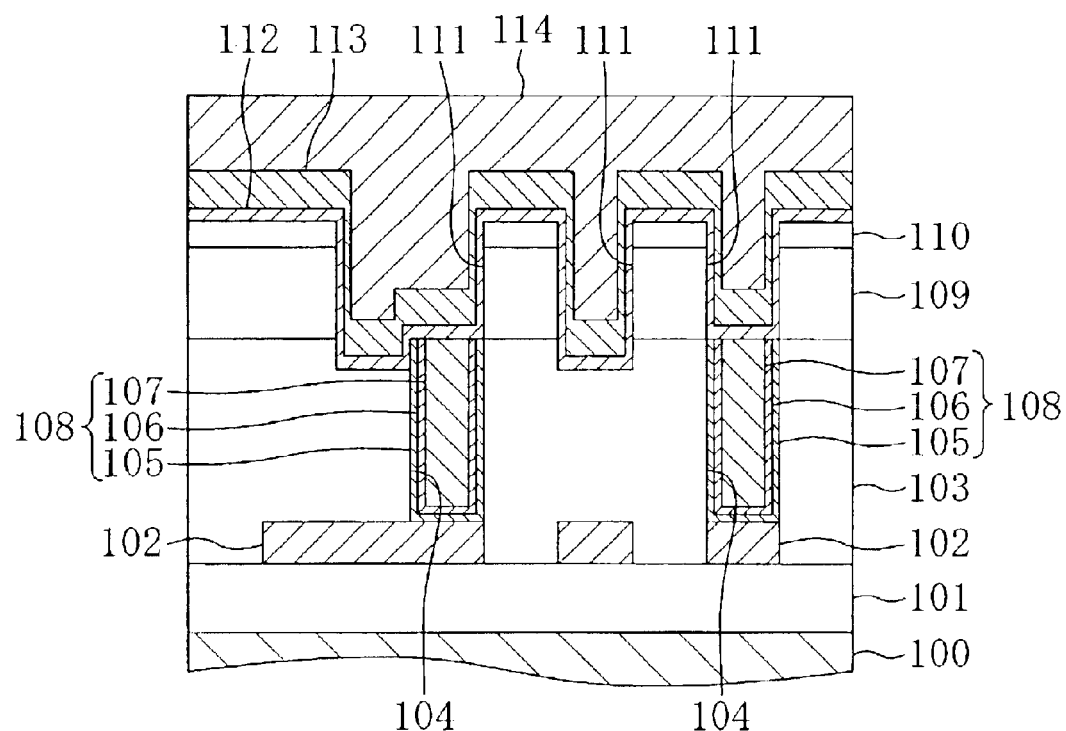
FIGS. 3A and 3B are cross-sectional views illustrating the individual process steps of the method for forming a wiring structure according to the first embodiment.

Next, as shown in FIG. 3A, a tantalum nitride (TaN) film 112 and a first copper (Cu) film 113 are deposited successively by, e.g., PVD over the ARL film 110 such that each of the wiring grooves 111 is filled midway therewith. The first copper film 113 functions herein as a seed layer in the subsequent plating step, while the tantalum nitride film 112 functions as a barrier layer. Subsequently, a second copper film 114 is deposited by, e.g., plating on the first copper film 113 such that each of the wiring grooves 111 is filled completely therewith.

Figure 3B:
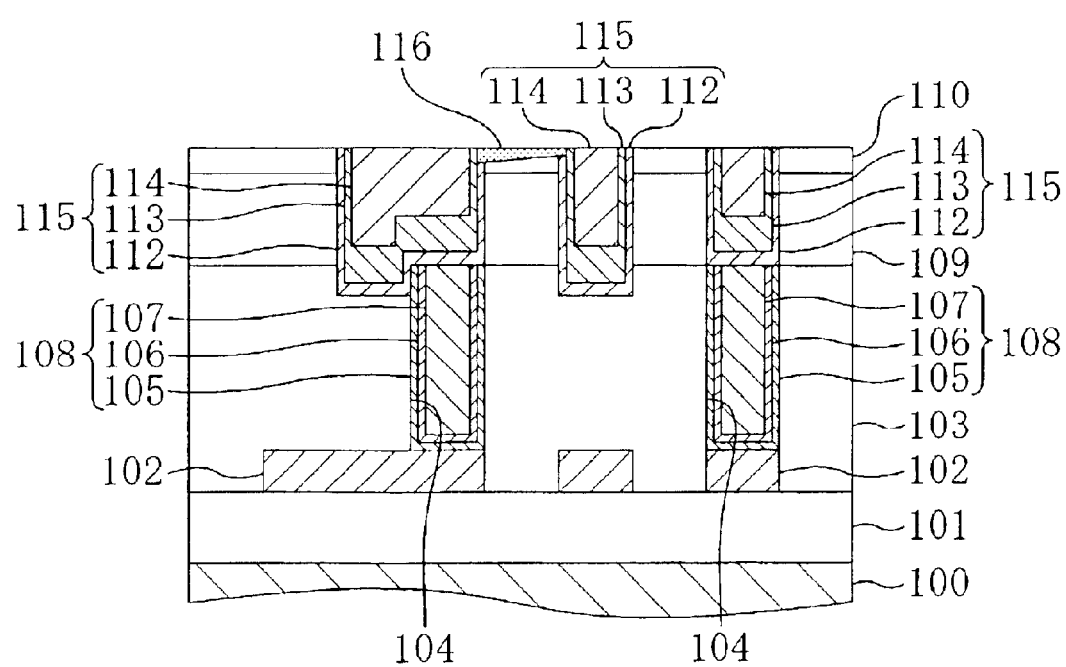

Then, as shown in FIG. 3B, the respective portions of the first and second copper films 113 and 114 deposited on regions outside the wiring grooves 111 are removed by CMP using an abrasive agent (slurry) for polishing Cu (first polishing step). This exposes the portions of the tantalum nitride film 112 outside the wiring grooves 111. Subsequently, the portions of the tantalum nitride film 112 deposited on regions outside the wiring grooves 111 are removed by CMP using a slurry for polishing a barrier layer (TaN) (second polishing step). As a result, copper wires (upper-layer wires) 115 each having a barrier layer between itself and the FSG film 109 are formed in the individual wiring grooves 111 and a surface of the ARL film 110 is exposed. The copper wires 115 are connected electrically to the plugs 108 formed thereunder.

The first and second polishing steps will be described below in greater detail. The present embodiment performs each of the first and second polishing steps by using the same CMP system.

Figure 5:
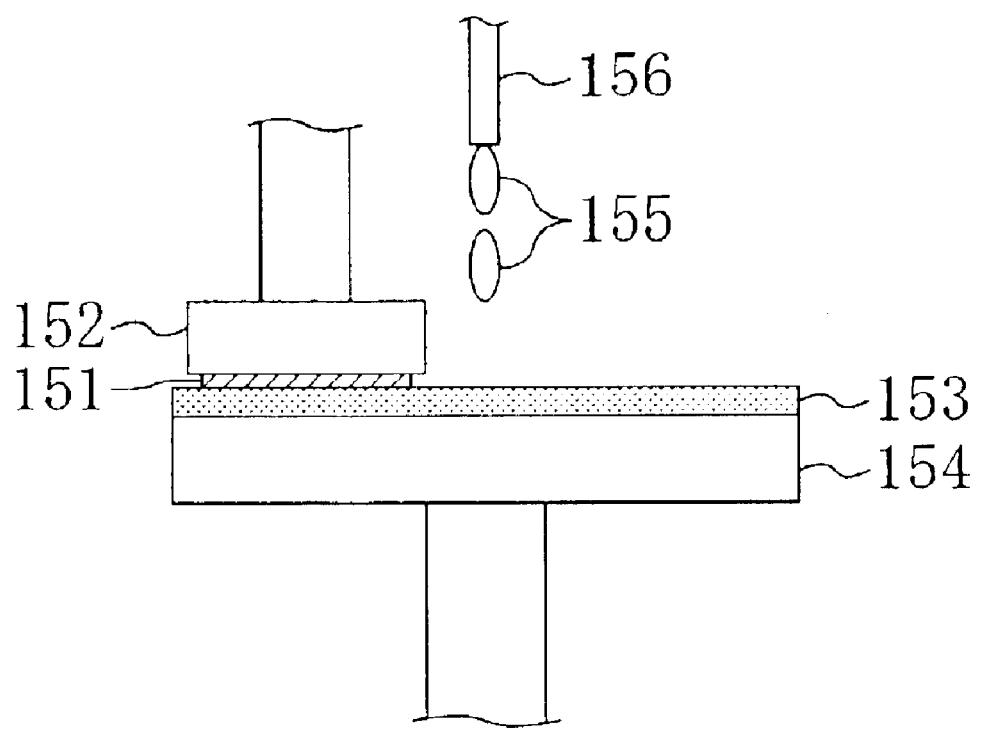
FIG. 5 is a schematic structural view of a CMP system used in the method for forming a wiring structure according to the first or second embodiment of the present invention.

FIG. 5 is a schematic structural view of the CMP system used in the first and second polishing steps.

As shown in FIG. 5, a wafer 151 as a substrate to be polished (substrate 100) is held by a holder 152 provided rotatable and vertically movable. A polishing pad 153 for polishing a surface of the wafer 151 is attached to a surface of a platen 154 performing a rotating movement. A slurry 155 is supplied dropwise from a slurry supply pipe 156 onto the polishing pad 153. If the platen 154 is rotated in this state to rotate the polishing pad 153 and the holder 152 is lowered in level while it is rotated, the wafer 151 held by the holder 152 and the polishing pad 153 rub each other, whereby the surface of the wafer 151 is polished.

The present embodiment changes polishing conditions including the type of the slurry in a transition from the first polishing step to the second polishing step. Specifically, the pressure under which the wafer 151 is pressed onto the polishing pad 153 and the rotating speed of the polishing pad 153 are lower in the second polishing step than in the first polishing step. If the wafer 151 rotates in conjunction with the holder 152, the rotating speed of the polishing pad 153 indicates the relative velocity of the polishing pad 153 to the wafer 151 in the present specification.

At the end time of the second polishing step using CMP as described above, a metal 116 such as copper is buried in a crack formed in the surface of the ARL film 110 between the copper wires 115, as shown in FIG. 3B. If the metal 116 buried in the crack forms a pseudocross-linking structure between the copper wires 115, a short circuit occurs between the copper wires 115 disadvantageously.

To reduce the frequency of short circuits occurring between the copper wires 115, while minimizing a reduction in the thickness of the copper film composing the copper wires 115, the present embodiment removes the metal 116 buried in the crack by using the following method.

After the completion of the second polishing step, the substrate 100 (wafer 151) is retrieved from the CMP system and the surface of the substrate 100 is cleaned. This allows shavings (foreign matter) produced in the first or second polishing step to be washed away from the surface of the substrate 100. For example, an organic acid solution or an organic alkaline solution is used for the cleaning of the substrate 100. It is important here to remove the shavings as the foreign matter. If the metal 116 buried in the crack in the surface of the ARL film 110 is removed with the shavings left on the substrate 100, the shavings may cause new damage to the ARL film 110 or to the copper wires 115.

Specifically, even if the metal 116 buried initially in the crack is removed successfully, the copper wires 115 may be damaged (i.e., the copper film composing the copper wires 115 may be thinned) or the metal may be buried in a new crack formed in the ARL film 110.

In the present embodiment, the cleaning step (foreign matter removing step) for the substrate 100 (wafer 151) described above is performed by moving the substrate 100 from the CMP system to a cleaning system. Preferably, while the substrate 100 is cleaned, shavings (foreign matter) adhered to the polishing pad 153 are removed therefrom separately. The reason for this is the same as in the case of cleaning the substrate 100 described above. By removing the shavings remaining on the polishing pad 153 therefrom, new damage to the surface of the ARL film 110 or the like when the metal 115 buried in the crack in the surface of the ARL film 110 on the substrate 100 is removed therefrom by continuously using the polishing pad 153 can be prevented more reliably. The removing of the shavings remaining on the polishing pad 153 is performed by, e.g., supplying pure water in place of the slurry while rotating the polishing pad 153 in the CMP system to clean the polishing pad 153. Alternatively, the shavings may be removed by brushing the surface of the polishing pad 153 with a grindstone. These ensure the removal of the shavings adhered to the surface of the polishing pad 153.

Figure 4:
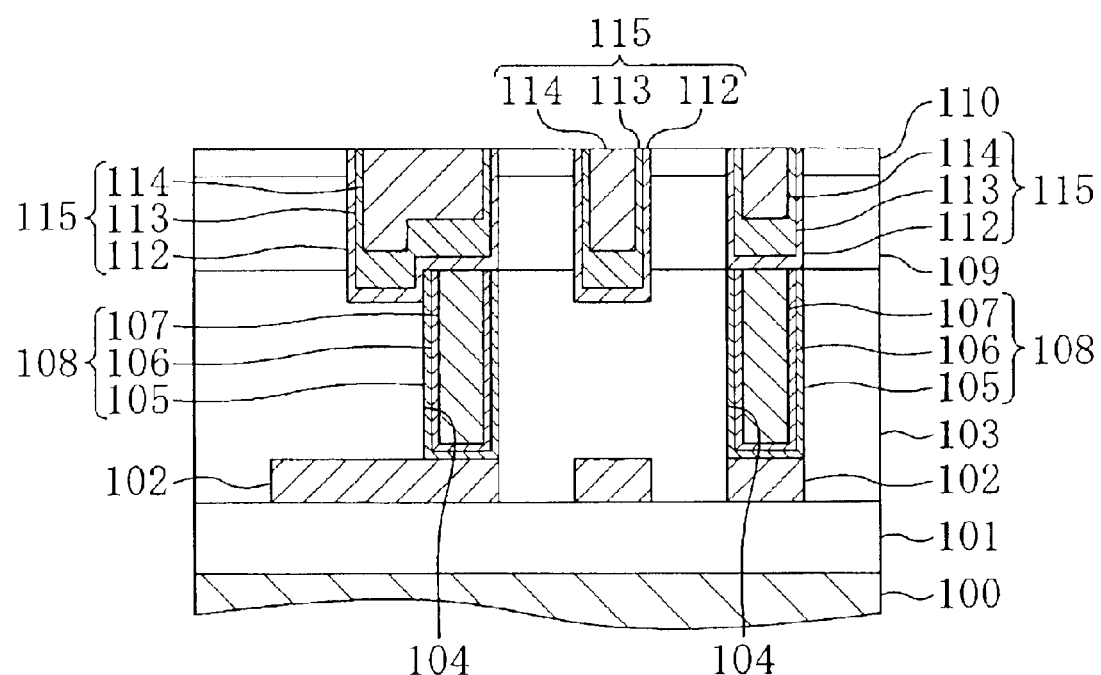
FIG. 4 is a cross-sectional view showing one of the process steps of the method for forming a wiring structure according to the first embodiment.

Next, after the foreign matter removing step, the surface of the ARL film 110 is polished by CMP (third polishing step) such that the metal 116 buried in the microcrack in the surface of the ARL film 110 is removed therefrom. This allows the metal 116 in the crack which may cause a short circuit between wires to be removed together with the crack, as shown in FIG. 4.

The present embodiment performs the third polishing step by using the same CMP system (see FIG. 5) as used in the first and second polishing steps. The polishing conditions for the third polishing step except for the polishing time are the same as in the second polishing step (i.e., the polishing step for the tantalum nitride film 112 (barrier metal film)). Specifically, the pressure under which the substrate 100 (wafer 151) is pressed onto the polishing pad 153 and the rotating speed of the polishing pad 153 in the third polishing step are the same as those in the second polishing step. Accordingly, the foregoing pressure and rotating speed are lower in the third polishing step than in the first polishing step (polishing step for the copper films 113 and 114). The slurry used in the third polishing step is a slurry for polishing the barrier layer (TaN), which is the same as in the second polishing step. On the other hand, the polishing time in the third polishing step is adjusted to a time shorter (e.g., about 20 seconds) than the polishing time of the barrier metal film in the second polishing step. The reason for this is that the third polishing step aims at removing the unneeded metal 116 buried in the crack in the fragile ARL film 110 and a reduction in the thickness of a film other than the ARL film 110, e.g., the copper film composing the copper wires 115 is intended to be minimized. Moreover, proper polishing is performed with respect to the ARL film 110 since the polishing conditions for the third polishing step except for the polishing time are the same as those in the second polishing step, so that the metal 116 buried in the surface of the ARL film 110 is removed by the proper polishing. Furthermore, the copper film composing the copper wires 115 is prevented from being significantly polished since the polishing conditions for the third polishing step (including the pressure under which the substrate is pressed onto the polishing pad, the rotating speed of the polishing pad, the slurry, and the polishing time) are such that copper is less likely to be polished thereunder.

Thus, according to the first embodiment, the barrier metal film (the tantalum nitride film 112) and the wiring conductive films (the copper films 113 and 114) are buried successively in the wiring grooves 111 formed in the FSG film 109 on the substrate 100 and in the ARL film 110 on the FSG film 109 and then the respective portions of the wiring conductive films and the barrier metal film located outside the wiring grooves 111 are removed by polishing. After the foreign matter (shavings) adhered to the substrate 100 during polishing is then removed, the surface of the ARL film 110 is polished. This achieves the following effects when a microcrack is formed in the surface of the ARL film 110 present between the wiring grooves 111 (i.e., between the copper wires 115) and the metal 116 is buried in the crack during the polishing of the barrier metal film. Since final polishing is performed with respect to the surface of the ARL film 110 after the removal of the foreign matter adhered to the substrate 100 during the polishing of the barrier metal film, it becomes possible to remove the metal 116 buried in the crack therefrom, while preventing new damage caused by the foreign matter to the surface of the ARL film 110. This allows the situation in which the metal 116 buried in the crack causes cross-linking between the copper wires 115 to be circumvented and thereby allows a wiring structure in which the occurrence of short circuits between wires is suppressed, i.e., high-performance wiring to be formed.

Figure 6A:
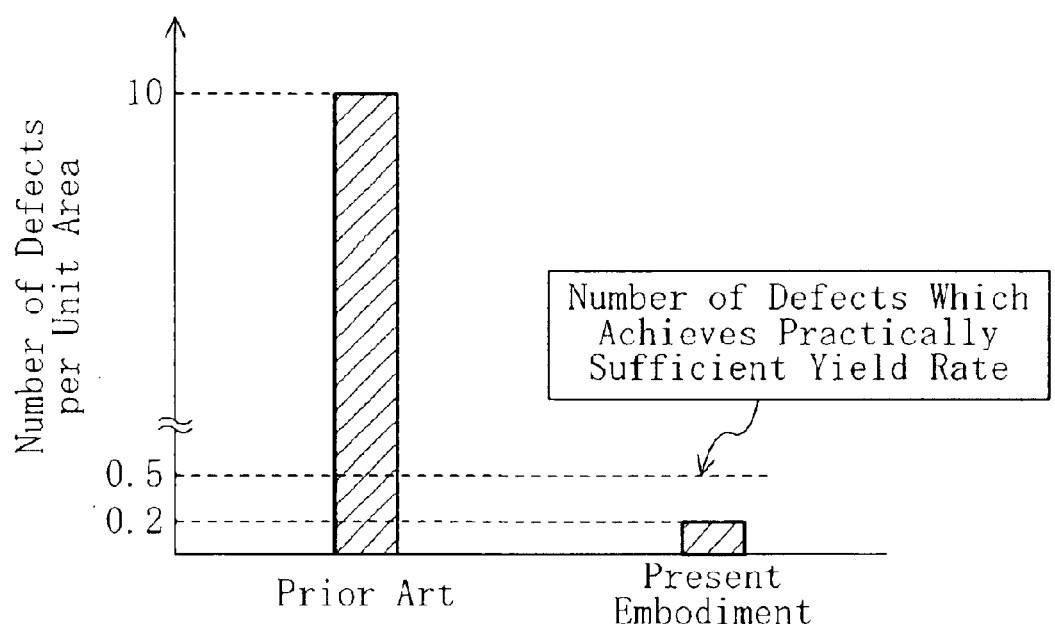
FIG. 6A shows the result of a comparison made between the respective frequencies of short circuits occurred between copper wires formed by the method for forming a wiring structure according to the first embodiment and those formed by the prior art technology and FIG. 6B is a view diagrammatically showing the spacing between wires and the width of each of the wires in a wiring structure formed by the method for forming a wiring structure according to the first embodiment.
Figure 6B:
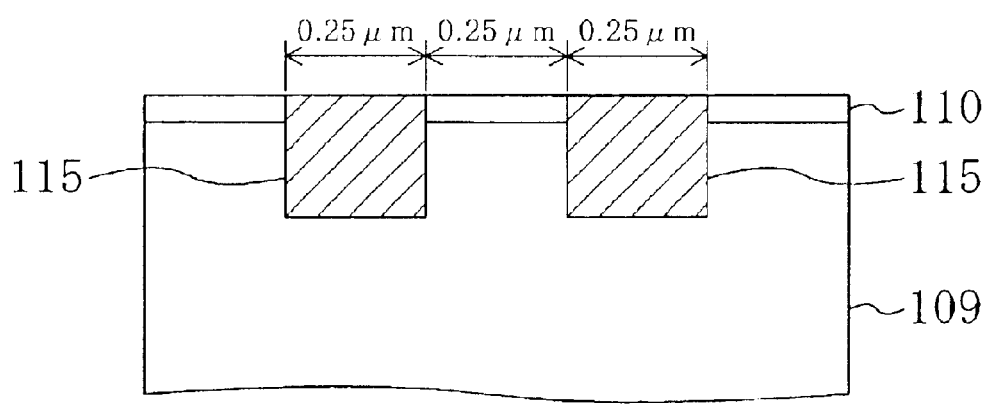

FIG. 6A shows the result of a comparison made between the respective frequencies of short circuits occurred between the copper wires formed by the method for forming a wiring structure according to the present embodiment and those formed by the prior art technology. FIG. 6B diagrammatically shows the spacing between the wires and the width of each of the wires in a wiring structure formed by the method for forming a wiring structure according to the present embodiment. In FIG. 6A, the vertical axis represents the number of defects (the number of scars (cracks) in the surface of the ARL film which may cause short circuits) per unit area (1 cm$^2$). As shown in FIG. 6B, the spacing between the copper wires 115 formed in the FSG film 109 and in the ARL film 110 by the method for forming a wiring structure according to the present embodiment is 0.25 μm and the width of each of the copper wires 115 is also 0.25 μm. As shown in FIG. 6A, the present embodiment can reduce the number of defects which may cause short circuits to about 0.2 corresponding to about 1/50 of the number achieved with the prior art technology by successively performing the cleaning of the surface of the substrate 100 (removal of shavings) and the polishing of the surface of the ARL film 110 after the polishing of the barrier metal film (tantalum nitride film 112). In other words, the number of defects in the present embodiment is far below 0.5, which is the number of defects that allows a practically sufficient yield rate to be achieved.

With the prior art technology, short circuits between wires began to occur frequently as the spacing between the adjacent wires is reduced, especially when the wire-to-wire spacing becomes 0.25 μm or less. By contrast, the present embodiment more remarkably achieves the effect of preventing the short circuits between wires when the wire-to-wire spacing is 0.25 μm or less.

According to the first embodiment, the pressure under which the substrate 100 is pressed onto the polishing pad 153 and the rotating speed of the polishing pad 153 in the third polishing step (polishing step for the ARL film 110) are the same as in the second polishing step (polishing step for the tantalum nitride film 112). In other words, the polishing conditions for the third polishing step except for the polishing time are the same as in the second polishing step. This obviates the necessity to make intricate changes to the polishing conditions in a transition from the second polishing step to the third polishing step. Consequently, work efficiency in the formation of wiring is improved and a reduction in process throughput is prevented. Since the polishing time is shorter in the third polishing step than in the second polishing step, the surface of the ARL film 110 is prevented from being significantly scraped off. If the foregoing pressure and rotation speed are lower in the third polishing step than in the first polishing step (polishing step for the copper films 113 and 114), the significant scraping-off of the surface of the ARL film 110 can be prevented more reliably.

Embodiment 2

Referring to the drawings, a description will be given herein below to a method for forming a wiring structure according to a second embodiment of the present invention. The second embodiment is different from the first embodiment in that it uses a dual damascene method for the formation of copper wires.

FIGS. 7A to 7C and FIGS. 8A and 8B are cross-sectional views illustrating the individual process steps of the method for forming a wiring structure according to the second embodiment.

Figure 7A:
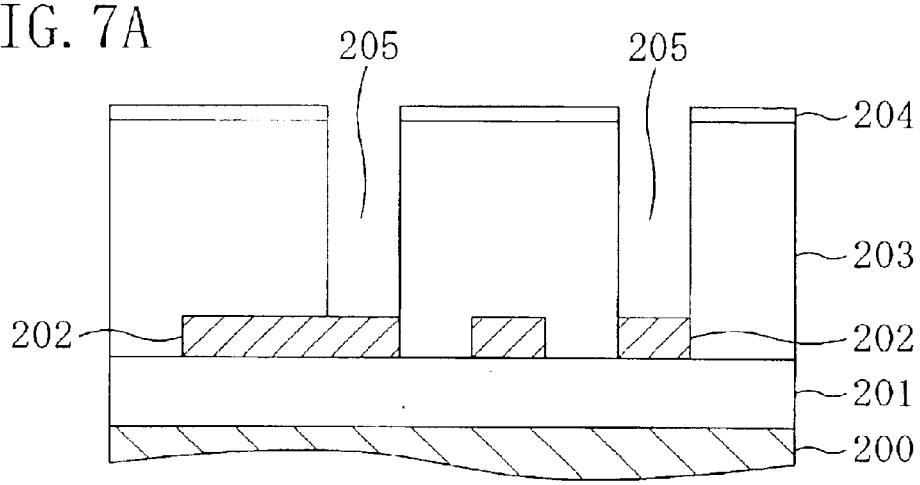
FIGS. 7A to 7C are cross-sectional views illustrating the individual process steps of the method for forming a wiring structure according to the second embodiment of the present invention.

First, as shown in FIG. 7A, a first silicon dioxide film 201 is formed on a substrate 200 composed of, e.g., silicon. Then, lower-layer wires 202 each composed of, e.g., a tungsten film are formed on the first silicon dioxide film 201. Thereafter, a second silicon dioxide film 203 and an ARL film 204 are deposited successively by, e.g., CVD over the upper surface of the first silicon dioxide film 201 including the upper surfaces of the lower-layer wires 202. The ARL film 204 has a two-layer structure consisting of, e.g., an upper-layer SiON film and a lower-layer SiO$_2$ film as well as the function of improving resolution during exposure in the subsequent lithographic step. Thereafter, via holes 205 reaching the lower-layer wires 202 are formed by lithography and dry etching in the ARL film 204 and in the second silicon dioxide film 203.

Figure 7B:
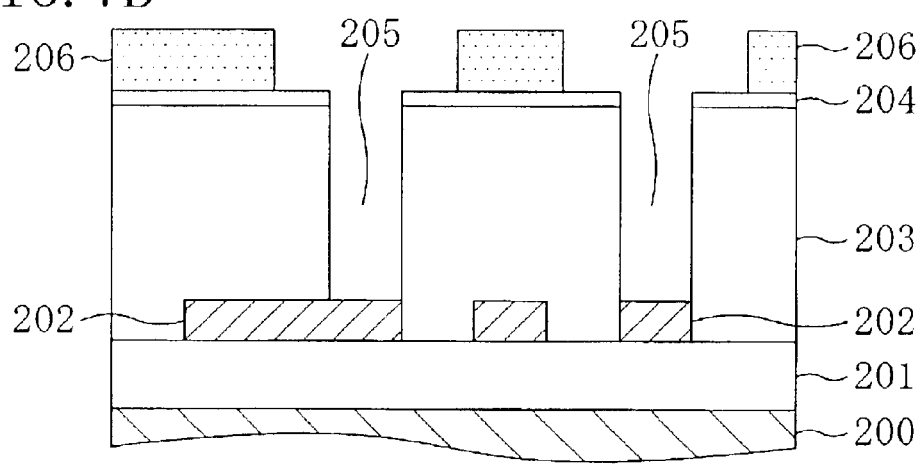

Next, as shown in FIG. 7B, a resist is coated on the entire surface of the substrate 200. Then, a resist pattern 206 having openings corresponding to regions to be formed with wiring grooves is formed by lithography.

Figure 7C:
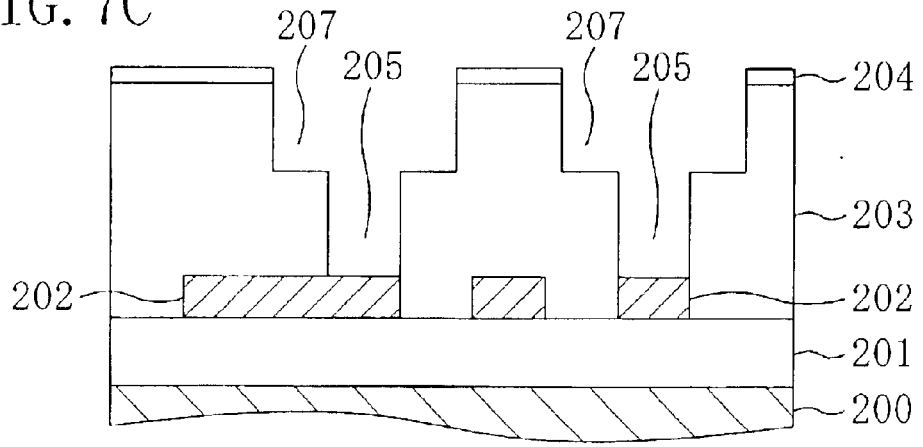

Next, as shown in FIG. 7C, dry etching is performed with respect to the ARL film 204 and to the second silicon dioxide film 203 by using the resist pattern 206 as a mask, thereby forming a plurality of wiring grooves 207. Then, the resist pattern 206 is removed by ashing. It is to be noted that the plurality of wiring grooves 207 include wiring grooves (formed in regions containing the upper portions of the original via holes 205) reaching the via holes 205. The wiring grooves 207 are arranged in, e.g., parallel with each other. The spacing between the wiring grooves 207 is about 0.25 μm.

Figure 8A:
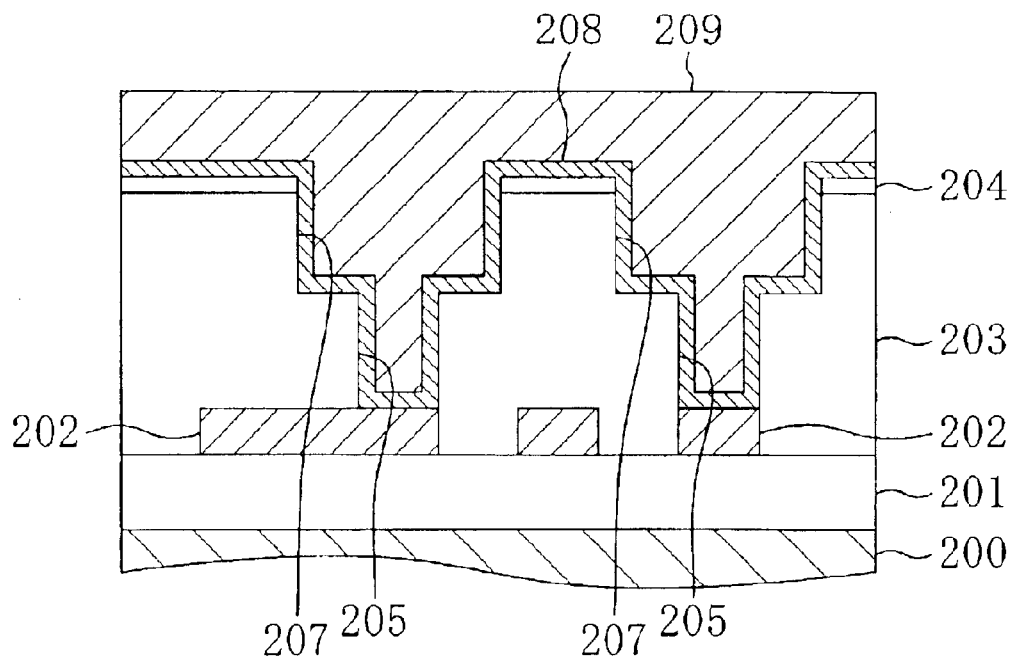
FIGS. 8A and 8B are cross-sectional views illustrating the individual process steps of the method for forming a wiring structure according to the second embodiment.

Next, as shown in FIG. 8A, a tantalum nitride (TaN) film 208 is deposited on the ARL film 204 such that each of the wiring grooves 207 and the via holes 205 is filled midway therewith. The tantalum nitride film 208 functions as a barrier layer. Subsequently, a copper film 209 is deposited on the tantalum nitride film 208 such that each of the wiring grooves 207 and the via holes 205 is filled completely therewith.

Figure 8B:
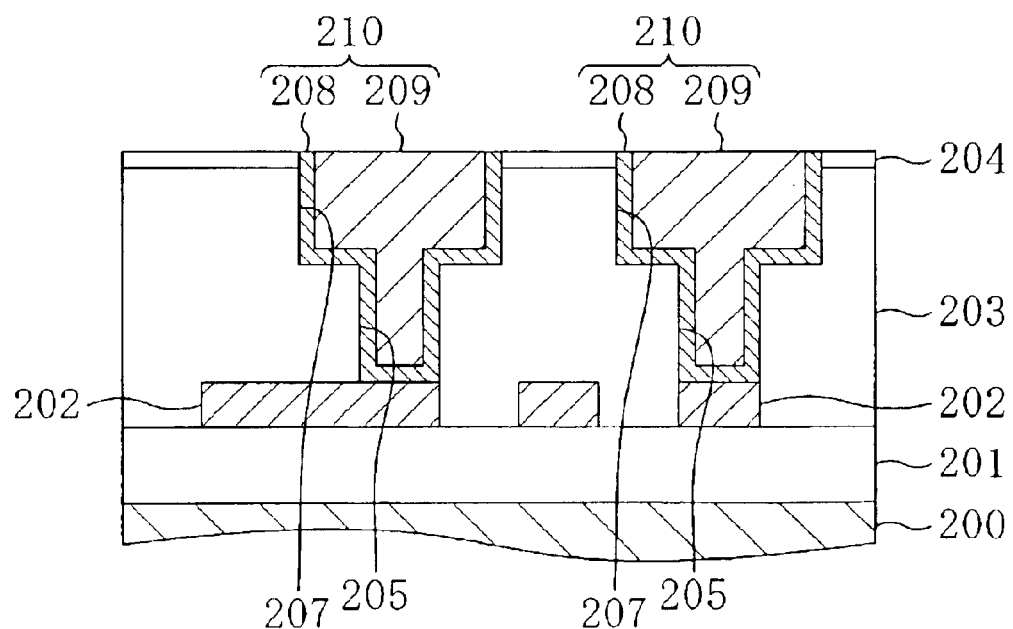
Figure 9A:
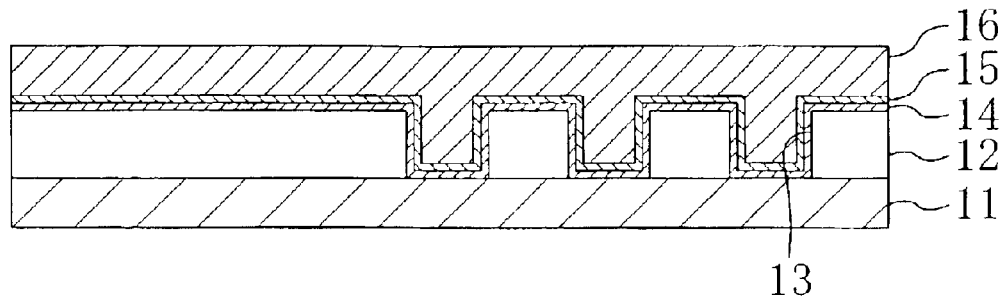
FIGS. 9A to 9C are cross-sectional views illustrating the individual process steps of a conventional method for forming a wiring structure.
Figure 9B:
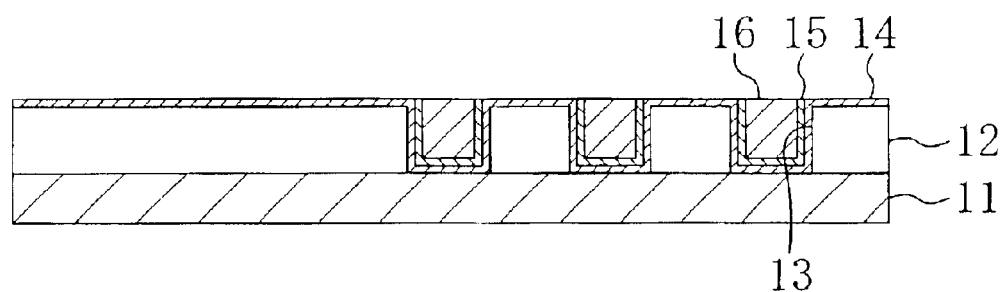
Figure 9C:
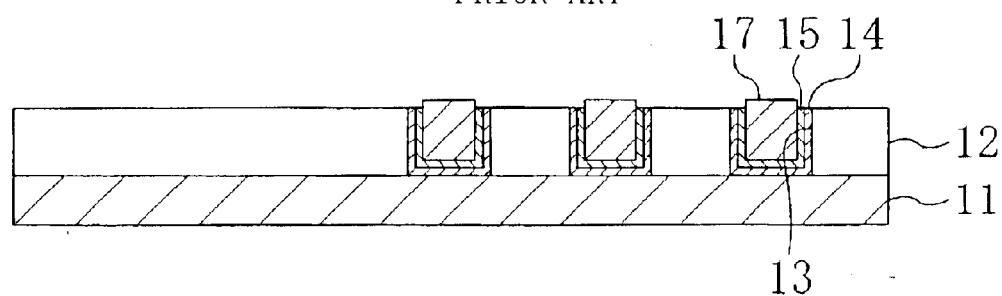
Figure 10:
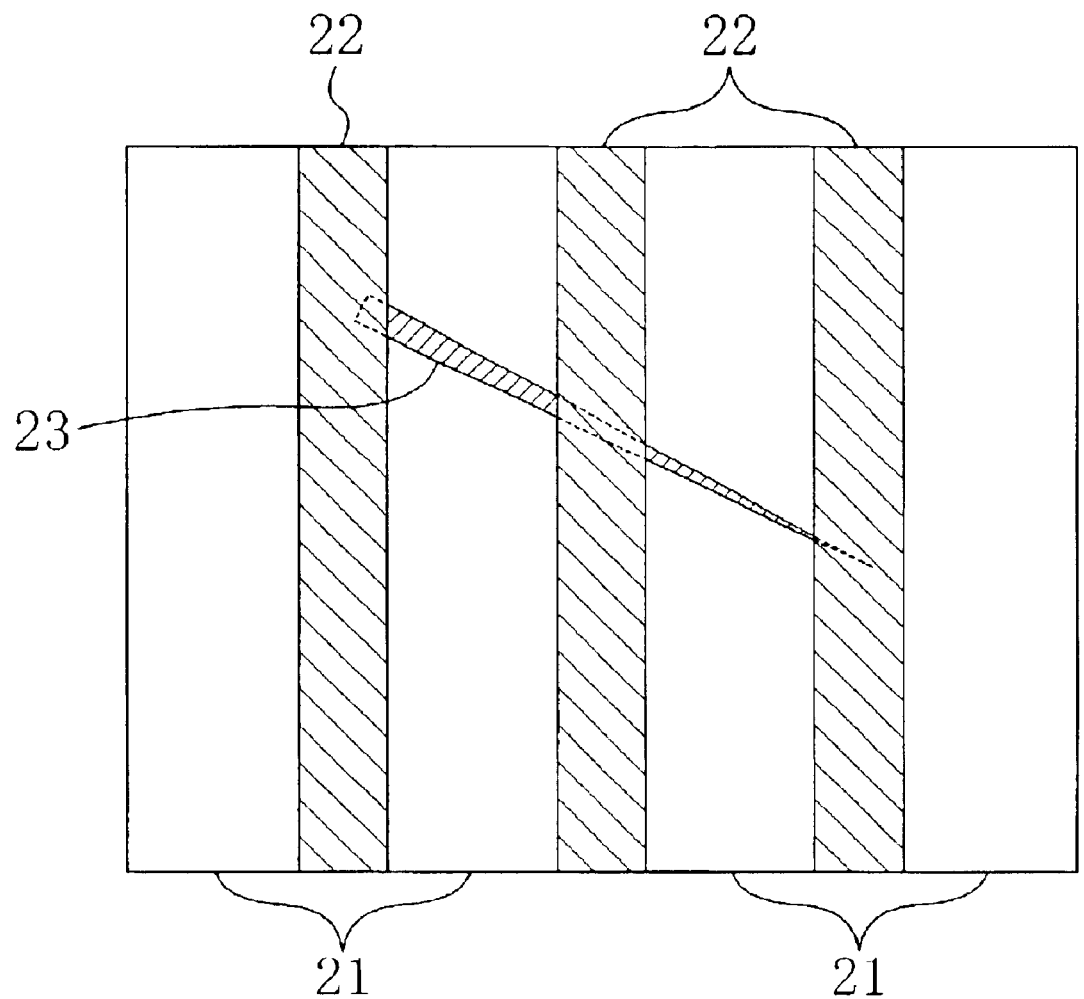
FIG. 10 is a view for illustrating the problem of the conventional method for forming a wiring structure.

Next, as shown in FIG. 8B, the portions of the copper film 209 deposited on regions outside the wiring grooves 207 and the via holes 205 are removed by CMP using a slurry for polishing Cu (first polishing step). This exposes the portions of the tantalum nitride film 208 located outside the wiring grooves 207 and the via holes 205.

Subsequently, the portions of the tantalum nitride film 208 deposited on regions outside the wiring grooves 207 and the via holes 205 are removed by CMP using a slurry for polishing the barrier layer (TaN) (second polishing step). As a result, copper wires (upper-layer wires) 210 each having a barrier layer between itself and an insulating film such as the second silicon dioxide film 203 are formed in the individual wiring grooves 207 and in the individual via holes 205 and a surface of the ARL film 204 is exposed. The copper wires 210 have plug portions formed in the via holes 205 and connected electrically to the lower wires 202.

The present embodiment also performs each of the first and second polishing steps by using the same CMP system (see FIG. 5), similarly to the first embodiment. The present embodiment also changes polishing conditions including the type of the slurry in a transition from the first polishing step to the second polishing step. Specifically, the pressure under which the substrate 200 is pressed onto the polishing pad and the rotating speed of the polishing pad are lower in the second polishing step than in the first polishing step.

At the end time of the second polishing step using CMP as described above, a metal such as copper (not shown) is buried in a crack formed in the surface of the ARL film 204 between the copper wires 210. If the metal buried in the crack forms a pseudocross-linking structure between the copper wires 210, a short circuit occurs between the copper wires 210 disadvantageously.

To reduce the frequency of short circuits occurring between the copper wires 210, while minimizing a reduction in the thickness of the copper film composing the copper wires 210, the present embodiment removes the metal buried in the crack by using the following method.

After the completion of the second polishing step, the substrate 200 is retrieved from the CMP system and the surface of the substrate 200 is cleaned. This allows shavings (foreign matter) produced in the first or second polishing step to be washed away from the surface of the substrate 200. For example, an organic acid solution or an organic alkaline solution is used for the cleaning of the substrate 200. It is important here to remove the shavings as the foreign matter. If the metal buried in the crack in the surface of the ARL film 204 is removed with the shavings left on the substrate 200, the shavings may cause new damage to the ARL film 204 or to the copper wires 210. Specifically, even if the metal buried initially in the crack is removed successfully, the copper wires 210 may be damaged (i.e., the copper film composing the copper wires 210 may be thinned) or the metal may be buried in a new crack formed in the ARL film 204.

In the present embodiment, the cleaning step (foreign matter removing step) for the substrate 200 described above is performed by moving the substrate 200 from the CMP system to a cleaning apparatus. Preferably, while the substrate 200 is cleaned, the shavings (foreign matter) adhered to the polishing pad are removed therefrom separately. The reason for this is the same as in the case of cleaning the substrate 200 described above. By removing the shavings remaining on the polishing pad therefrom, new damage to the surface of the ARL film 204 or the like when the metal buried in the crack in the surface of the ARL film 204 on the substrate 200 is removed by continuously using the polishing pad can be prevented more reliably. The cleaning of the polishing pad is performed by, e.g., supplying pure water in place of the slurry while rotating the polishing pad in the CMP system to clean the polishing pad. Alternatively, the shavings may be removed by brushing the surface of the polishing pad with a grindstone. These ensure the removal of the shavings adhered to the surface of the polishing pad.

Next, after the foreign matter removing step, the surface of the ARL film 204 is polished by CMP (third polishing step) such that the metal buried in the microcrack in the surface of the ARL film 204 is removed therefrom. This allows the metal in the crack which may cause a short circuit between wires to be removed together with the crack.

The present embodiment also performs the third polishing step by using the same CMP system (see FIG. 5) as used in the first and second polishing steps, similarly to the first embodiment. The polishing conditions for the third polishing step except for the polishing time are the same as in the second polishing step (i.e., the polishing step for the tantalum nitride film 208 (barrier metal film)). Specifically, the pressure under which the substrate 200 is pressed onto the polishing pad and the rotating speed of the polishing pad in the third polishing step are the same as those in the second polishing step. Accordingly, the foregoing pressure and rotating speed are lower in the third polishing step than in the first polishing step (polishing step for the copper film 209). The slurry used in the third polishing step is a slurry for polishing the barrier layer (TaN), which is the same as in the second polishing step. On the other hand, the polishing time in the third polishing step is adjusted to a time shorter (e.g., about 20 seconds) than the polishing time of the barrier metal film in the second polishing step. The reason for this is that the third polishing step aims at removing the unneeded metal buried in the crack in the fragile ARL film 204 and a reduction in the thickness of a film other than the ARL film 204, e.g., the copper film composing the copper wires 210 is intended to be minimized. Moreover, proper polishing is performed with respect to the ARL film 204 since the polishing conditions for the third polishing step except for the polishing time are the same as those in the second polishing step, so that the metal buried in the surface of the ARL film 204 is removed by the proper polishing. Furthermore, the copper film composing the copper wires 210 is prevented from being significantly polished since the polishing conditions for the third polishing step (including the pressure under which the substrate is pressed onto the polishing pad, the rotating speed of the polishing pad, the slurry, and the polishing time) are such that copper is less likely to be polished thereunder.

Thus, according to the second embodiment, the barrier metal film (the tantalum nitride film 208) and the wiring conductive film (the copper film 209) are buried successively in the wiring grooves 207 and via holes 205 formed in the ARL film 204 and the second silicon dioxide film 203 on the substrate 200 and then the respective portions of the wiring conductive film and the barrier metal film located outside the wiring grooves 207 and the via holes 205 are removed by polishing. After the foreign matter (shavings) adhered to the substrate 200 during polishing is then removed, the surface of the ARL film 204 is polished. This achieves the following effects when a microcrack is formed in the surface of the ARL film 204 present between the wiring grooves 207 (i.e., between the copper wires 210) and the metal is buried in the crack during the polishing of the barrier metal film. Since final polishing is performed with respect to the surface of the ARL film 204 after the removal of the foreign matter adhered to the substrate 200 during the polishing of the barrier metal film, it becomes possible to remove the metal buried in the crack therefrom, while preventing new damage caused by the foreign matter to the surface of the ARL film 204. This allows the situation in which the metal buried in the crack causes cross-linking between the copper wires 210 to be circumvented and thereby allows a wiring structure in which the occurrence of short circuits between wires is suppressed, i.e., high-performance wiring to be formed.

With the prior art technology, short circuits between wires began to occur frequently as the spacing between the adjacent wires is reduced, especially when the wire-to-wire spacing becomes 0.25 $\mu$m or less. By contrast, the present embodiment more remarkably achieves the effect of preventing the short circuits between wires when the wire-to-wire spacing is 0.25 $\mu$m or less.

According to the second embodiment, the pressure under which the substrate 200 is pressed onto the polishing pad and the rotating speed of the polishing pad in the third polishing step (polishing step for the ARL film 204) are the same as in the second polishing step (polishing step for the tantalum nitride film 208). In other words, the polishing conditions for the third polishing step except for the polishing time are the same as in the second polishing step. This obviates the necessity to make intricate changes to the polishing conditions in a transition from the second polishing step to the third polishing step. Consequently, work efficiency in the formation of wiring is improved and a reduction in process throughput is prevented. Since the polishing time is shorter in the third polishing step than in the second polishing step, the surface of the ARL film 204 is prevented from being significantly scraped off. If the foregoing pressure and rotation speed are lower in the third polishing step than in the first polishing step (polishing step for the copper film 209), the significant scraping-off of the surface of the ARL film 204 can be prevented more reliably.

Although the first or second embodiment has described the case where the first-layer copper wires are formed by using the ARL film, the method according to the present embodiment may also be applied to the formation of upper-layer copper wires in the second and higher-level layers when multilayer copper wiring is formed by using an ARL film. The method according to the present embodiment may also be applied to the case where wires are formed by burying a conductive film other than a copper film in the wiring grooves.

In the first or second embodiment, the type of the barrier metal film is not particularly limited. If a copper film is used as a wiring conductive film, e.g., a tantalum film, a tantalum nitride film, or a multilayer film composed of a tantalum film and a tantalum nitride film is used preferably. The types of an insulating film and an ARL film in each of which wires are buried are not particularly limited, either.

Preferably, the first or second embodiment performs the cleaning of the substrate by using an organic acid solution or an organic alkaline solution in the foreign matter removing step (substrate cleaning step) performed after the second polishing step (polishing of the barrier metal film). This ensures the removal of a foreign matter (residual shavings) adhered to the surface of the substrate. As the organic alkali used in this step, a hydroxylamine such as TMAH (tetramethylammonium hydride) may also be used. As the organic acid used in this step, a carboxylic acid having two or more carboxyl groups(—COOH groups) such as an oxalic acid, a citric acid, or a malic acid may also be used.

In the first or second embodiment, the type of the slurry for polishing Cu and the type of the slurry for polishing the barrier layer (TaN) are not particularly limited. A slurry for polishing Cu containing, e.g., an aqueous hydrogen peroxide as an oxidizing agent, a slurry for polishing TaN containing, e.g., a nitric acid (or a derivative compound thereof) as an oxidizing agent, and the like may also be used. Alternatively, a slurry for polishing Cu and a slurry for polishing TaN having mutually different particles sizes may also be used. Although the type of the slurry used in the third polishing step is not particularly limited, a slurry for polishing the barrier layer is used preferably in the same manner as in the second polishing step. This prevents the wiring conductive film from being significantly polished in the third polishing step so that an increase in wiring resistance is prevented. This also allows easier changes made to the polishing conditions in a transition from the second polishing step to the third polishing step.

It is also possible to perform the third polishing step in two stages, perform polishing in the first stage of the third polishing step under the same conditions as in the first polishing step, and continuously perform polishing in the second stage of the third polishing step under the same conditions as in the second polishing step. This further improves a yield rate in the formation of wiring.

Although the first or second embodiment has performed each of the first to third polishing steps by using the same CMP system, it is also possible to perform the individual polishing steps by using different CMP systems instead or perform any one of the polishing steps by using another CMP system instead. However, each of the second and third polishing steps is preferably performed by using the same polishing system and the same polishing pad. This allows effective management of the polishing system. A CMP system that can be used in the first to third polishing steps is not limited to a scheme having one substrate holder such that a single substrate is polished in one polishing step. It is also possible to use a CMP system having a plurality of substrate holders such that a plurality of substrates are polished in one polishing step.

What is claimed is:

1. A method for forming a wiring structure, the method comprising:
    a groove forming step of forming an anti-reflection film on an insulating film and then forming, in each of the anti-reflection film and the insulating film, a first groove and a second groove adjacent to the first groove;
    a film depositing step of depositing a barrier metal film and a conductive film on the anti-reflection film such that each of the first end second grooves is filled therewith;
    a first polishing step of removing the portion of the conductive film outside the first and second grooves by polishing;
    a second polishing step of removing, after the first polishing step, the portion of the barrier metal film outside the first and second grooves by polishing;
    a foreign matter removing step of removing a foreign matter adhered to a surface to be polished after the second polishing step therefrom; and
    a third polishing step of polishing, after the foreign matter removing step, a surface of the anti-reflection film.

2. The method of claim 1, further comprising, between the second and third polishing steps, the step of removing a foreign matter adhered to a polishing pad used in the second polishing step therefrom.

3. The method of claim 2, wherein the step of removing the foreign matter adhered to the polishing pad therefrom includes the step of cleaning the polishing pad.

4. The method of claim 2, wherein the step of removing the foreign matter adhered to the polishing pad therefrom includes the step of brushing a surface of the polishing pad with a grindstone.

5. The method of claim 1, wherein each of the second and third polishing steps is performed by using the same polishing system and the same polishing pad.

6. The method of claim 1, wherein a pressure under which the surface to be polished is pressed onto a polishing pad and a rotating speed of the polishing pad in the third polishing step are the same as in the second polishing step.

7. The method of claim 6, wherein a polishing time is shorter in the third polishing step than in the second polishing step.

8. The method of claim 6, wherein the pressure and the rotating speed are lower in the third polishing step than in the first polishing step.

9. The method of claim 1, wherein an abrasive agent used in the third polishing step is the same as used in the second polishing step.

10. The method of claim 1, wherein the third polishing step includes a polishing step performed in two stages under different polishing conditions.

11. The method of claim 10, wherein an abrasive agent used in one of the two stages of the polishing step is the same as used in the second polishing step and an abrasive agent used in the other of the two stages of the polishing step is the same as used in the first polishing step.

12. The method of claim 1, wherein the foreign matter removing step includes the step of cleaning the surface to be polished by using an organic acid or an organic alkali.

13. The method of claim 1, wherein a spacing between the first and second grooves is 0.25 $\mu$m or less.

14. The method of claim 1,wherein the first and second grooves are arranged in parallel with each other.

15. The method of claim 1, wherein formation of wires in the first and second grooves is performed by a dual damascene method.

16. The method of claim 1, wherein the and reflection film is composed of a silicon containing material.

17. The method of claim 1, wherein the conductive film is a copper film and the barrier metal film is a tantalum film, a tantalum nitride film, or a multilayer film composed of a tantalum film and a tantalum nitride film.

18. The method of claim 17, wherein a wire formed in the first or second groove is connected electrically to a plug formed under the wire.

19. A method for forming a wiring structure, the method comprising:
    a groove forming step of forming, in an anti-reflection film, a first groove and a second groove adjacent to the first groove;
    a film depositing step of depositing a conductive film on the anti-reflection film such that each of the first and second grooves is filled therewith;

a first CMP step of removing a portion of the conductive film outside the first and second grooves by polishing;

a foreign matter removing step of removing a foreign matter adhered to a surface of the anti-reflective film after the first CMP step; and a second CMP step of polishing a surface of the anti-reflection film after the foreign matter removing step.

20. The method of claim 19, wherein the conductive film comprises a wire metal and a barrier metal.

21. The method of claim 19, wherein the conductive film comprises a wire metal and a barrier metal film, and wherein the first CMP step comprises the steps of:

a first sub-step of removing a portion of the wire metal outside the first and second grooves by CMP, and a second sub-step of removing a portion of the barrier metal film outside the first and second grooves by CMP.

22. The method of claim 21, wherein each of the second sub-step and the second CMP step are performed by a single CMP system and a single polishing pad.

23. The method of claim 21, wherein a pressure under which the anti-reflection film is polished by a polishing pad and a rotating speed of the polishing pad in the second CMP step are the substantially same as in the second sub-step.

24. The method of claim 21, wherein a polishing time is shorter in the second CMP step than in the second sub-step.

25. The method of claim 21, wherein the pressure and the relating speed of a polishing pad are lower in the second CMP step than in the first sub-step.

26. The method of claim 21, wherein an abrasive agent used in the second CMP step is substantially the same as used in the second sub-step.

27. The method of claim 21, wherein the wire metal is a copper film and the barrier metal film is at least one of a tantalum film, a tantalum nitride film, or a multilayer film composed of a tantalum film and a tantalum nitride film.

28. The method of claim 19, further comprising, after the first CMP step and before the second CMP step, a step of cleaning a polishing pad used in the first CMP step, thereby removing the foreign matter adhered to the polishing pad.

29. The method of claim 19, wherein the step of foreign matter removing step includes;

a polishing pad cleaning step of removing the foreign matter adhered to a polishing pad.

30. The method of claim 29, wherein the polishing pad cleaning step includes the step of brushing a surface of the polishing pad.

31. The method of claim 19, wherein the second CMP step includes a polishing step performed in two stages under different polishing conditions.

32. The method of claim 31, wherein the conductive film comprises a wire metal and a barrier metal, and wherein the first CMP step comprises the steps of:

a first sub-step of removing a portion of the wire metal outside the first and second grooves by CMP, and a second sub-step of removing a portion of the barrier metal film outside the first and second grooves by CMP.

33. The method of claim 32, wherein an abrasive agent used in one of the two stages of the polishing step is substantially the same as used in the second-sub step, and an abrasive agent used in the other of the two stages of the polishing step is substantially the same as used in the first sub-step.

34. The method of claim 19, wherein the foreign matter removing step includes the step of cleaning a surface to be polished by using an organic acid or an organic alkali.

35. The method of claim 19, wherein a space between the first and second grooves is 0.25 $\mu$m or less.

36. The method of claim 19, wherein the first and second grooves are arranged in parallel with each other.

37. The method of claim 19, wherein formation of wires in the first and second grooves is a dual damascene structure.

38. The method of claim 19, wherein the anti-reflection film is composed of a silicon containing material.

39. The method of claim 19, wherein a wire formed in the first or second groove is connected electrically to a plug formed under the wire.

40. A method of claim 19, wherein the second CMP step is conducted to remove a metal in a micro-crack.

41. A method of claim 1, wherein the third polishing step is conducted to remove a metal in a micro-crack.

* * * * *